United States Patent
Rachkov

(10) Patent No.: US 8,245,388 B2
(45) Date of Patent: Aug. 21, 2012

(54) PROGRAMMER ACTUATOR SYSTEM AND METHOD OF OPERATION THEREOF

(75) Inventor: Rossen Atanassov Rachkov, Kenmore, WA (US)

(73) Assignee: Data I/O Corporation, Redmond, WA (US)

( * ) Notice: Subject to any disclaimer, the term of this patent is extended or adjusted under 35 U.S.C. 154(b) by 0 days.

(21) Appl. No.: 12/485,760

(22) Filed: Jun. 16, 2009

(65) Prior Publication Data

US 2009/0312857 A1    Dec. 17, 2009

Related U.S. Application Data

(60) Provisional application No. 61/061,970, filed on Jun. 16, 2008.

(51) Int. Cl.
H05K 3/36 (2006.01)
H05K 13/04 (2006.01)
B23P 19/00 (2006.01)
G11C 17/00 (2006.01)

(52) U.S. Cl. .................. 29/830; 29/729; 29/739; 365/94
(58) Field of Classification Search .................. 29/830, 29/729, 737, 739, 740, 741, 759; 324/73.1, 324/750.05; 365/94, 96, 200
See application file for complete search history.

(56) References Cited

U.S. PATENT DOCUMENTS

| 4,289,982 | A | * | 9/1981 | Smith | 365/185.25 |
|---|---|---|---|---|---|
| 4,407,555 | A | * | 10/1983 | Lockard | 439/296 |
| 4,578,751 | A | * | 3/1986 | Erwin | 711/103 |
| 4,791,661 | A | * | 12/1988 | Donaldson et al. | 379/93.17 |
| 4,799,021 | A | * | 1/1989 | Cozzi | 324/73.1 |
| 5,021,733 | A | * | 6/1991 | Ebihara et al. | 324/750.05 |
| 5,036,488 | A | * | 7/1991 | Motarjemi | 365/52 |
| 5,200,885 | A | * | 4/1993 | Hamilton et al. | 361/785 |
| 5,255,236 | A | * | 10/1993 | Maehara | 365/218 |
| 5,402,078 | A | * | 3/1995 | Hamilton | 324/750.14 |
| 6,629,317 | B1 | * | 9/2003 | Kirschner et al. | 717/175 |
| 2006/0085973 | A1 | * | 4/2006 | Kodama et al. | 29/740 |

OTHER PUBLICATIONS

Merriam-Webster's Collegiate Dictionary, Tenth Edition, p. 210, © 1994, definitioin of the term "clamp" as: "2 : any of various instruments or appliances having parts brought together for holding or compressing something."

* cited by examiner

*Primary Examiner* — David Angwin
(74) *Attorney, Agent, or Firm* — Mikio Ishimaru; Stanley Chang

(57) ABSTRACT

A method of operation of a programmer actuator system includes: placing a programming assembly, having socket boxes, in the programming actuator system; and clamping the programming assembly in the programmer actuator system using a pivoting arm bracket.

18 Claims, 4 Drawing Sheets

PROGRAMMER ACTUATOR SYSTEM AND METHOD OF OPERATION THEREOF

CROSS-REFERENCE TO RELATED APPLICATION(S)

This application claims the benefit of U.S. Provisional Patent Application Ser. No. 61/061,970 filed Jun. 16, 2008, and the subject matter thereof is incorporated herein by reference thereto.

TECHNICAL FIELD

The present invention relates generally to a manufacturing system for electronic products, and more particularly to a programmer actuator system

BACKGROUND ART

Certain operations of electronic circuit board assembly are performed away from the main production assembly lines. While various feeder machines and robotic handling systems populate electronic circuit boards with integrated circuits, the operations related to processing integrated circuits, such as programming, testing, calibration, and measurement are generally performed in separate areas on separate equipment rather than being integrated into the main production assembly lines.

For example, in the programming of programmable devices such as Flash memories (Flash), electrically erasable programmable read only memories ($E^2PROM$), programmable logic devices (PLDs), field programmable gate arrays (FPGAs), and microcontrollers incorporating non-volatile memory elements separate programming equipment is used which is often located in a separate area from the circuit board assembly lines.

There is a need for a system and system sub-assemblies that enable just-in time programming of multiple micro devices within a tape-on-reel manufacturing line. Tape-on-reel lines rely on carrier tapes with micro devices such as programmable devices placed at uniform distances on the tape. The micro devices on the tape are protected by a cover tape that is removed just prior to handling the micro device.

Thus, a need still remains for a system and system sub-assemblies that enable just-in time programming of multiple programmable devices within a tape-on-reel manufacturing line. In view of the lack of operational efficiency in the programming and packaging of programmable devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a programmer actuator system including: placing a programming assembly, having socket boxes, in the programming actuator system; and clamping the programming assembly in the programming actuator system using a pivoting arm bracket.

In addition, the present invention provides a programmer actuator system including: a programming assembly, having socket boxes, that fits within the programming actuator system; and a pivoting arm bracket for clamping the programming assembly in the programming actuator system.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
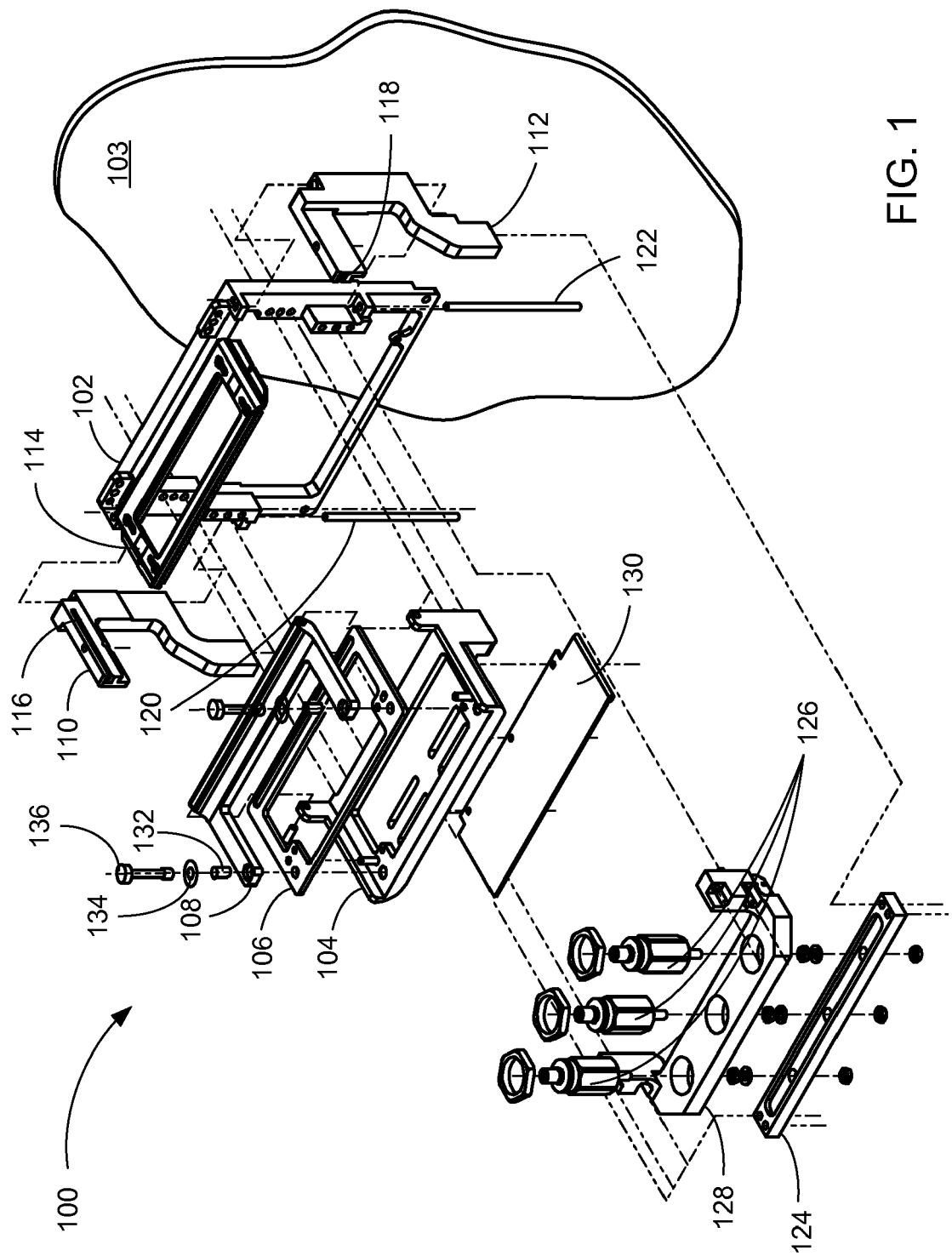
FIG. 1 is an exploded isometric view of a programmer actuator system constructed according to the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, the same numbers are used in all the drawing FIGs. to relate to the same elements. The embodiments have been numbered first embodiment, second embodiment, etc. as a matter of descriptive convenience and are not intended to have any other significance or provide limitations for the present invention.

Referring now to FIG. 1, therein is shown an exploded isometric view of a programmer actuator system 100 constructed according to the present invention. The term "vertical" as used herein is defined as a direction parallel to the direction defined by a first guide bar 120, regardless of its orientation. The term "horizontal" refers to a direction perpendicular to the vertical as just defined. Terms, such as "on", "above", "below", "bottom", "top", "side", "higher", "lower", "over", and "under", are defined with respect to the horizontal plane.

A mounting frame 102 is attached to an external manufacturing system 103. A support bracket 104 is attached to the mounting frame 102 permanently with screws (not shown). An external programming assembly (not shown) is mounted on a mounting plate 106. A pivoting arm bracket 108 pivots in the support bracket 104. The programmer actuator system 100 supports exchangeability of programmer assemblies compatible with different programmable device formats.

A first movable arm 110 and a second movable arm 112 support a sliding actuator plate 114, which slides in a first groove 116 in the first movable arm 110 and a second groove 118 in the second movable arm 112. The sliding actuator plate 114 moves downward when the first movable arm 110 and the second movable arm 112 are actuated down. The first movable arm 110 slides vertically on the first guide bar 120. Similarly, the second movable arm 112 slides vertically on a second guide bar 122.

The first movable arm 110 and the second movable arm 112 are held together by a cross bar 124. The cross bar 124 is pushed down by linear actuators 126 mounted in an actuator support bar 128, which is attached to the mounting frame 102. In the preferred embodiment of the invention, the linear actuators 126 are pneumatic cylinders.

The programmer actuator system 100 supports tape-on-reel operation. Programmable devices (not shown) are fed into the programmer actuator system 100 mounted on a tape (not shown). Once the programmable devices are programmed, the tape with the programmable devices removed moves on a guide plate 130, which is attached to and below the support bracket 104.

The pivoting arm bracket 108 is held in place using a spring 132, a washer 134, and a screw 136. It secures the programming assembly in place between the support bracket 104 and the mounting plate 106.

It was discovered that the programmer actuator system 100 of the present invention supports programming of multiple programmable devices within an in-line system, provides inter-exchangeability of programming assemblies compatible with different programmable device formats, and enables reduced set up times when the programmer actuator system 100 is configured for a specific programmable device format.

Figure 2:
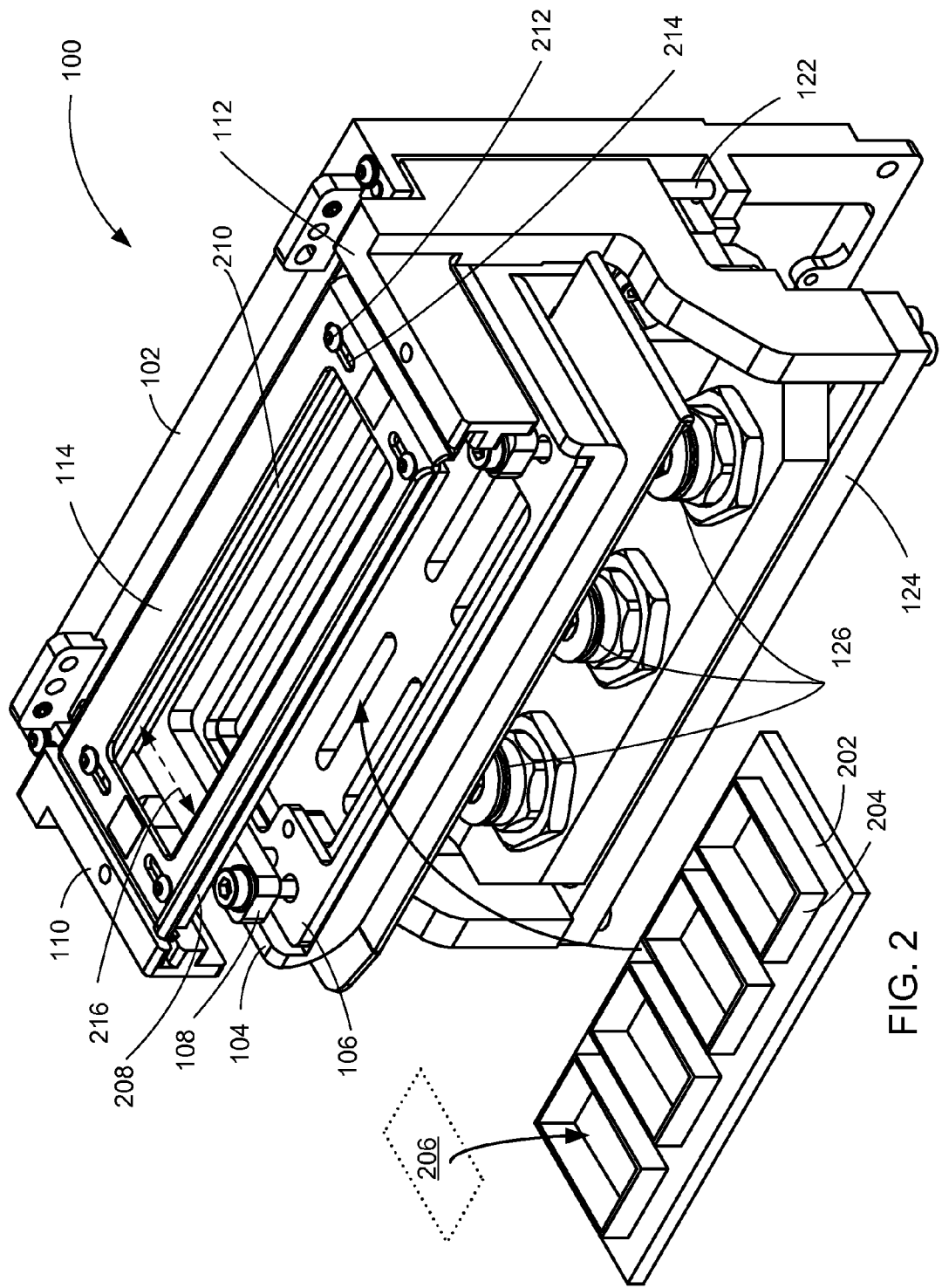
FIG. 2 is an isometric view of the programmer actuator system of FIG. 1.

Referring now to FIG. 2, therein is shown an isometric view of the programmer actuator system 100 of FIG. 1. A programming assembly 202 is placed between the pivoting arm bracket 108 and the mounting plate 106. The programming assembly 202 contains socket boxes 204 for a programmable device 206 that are accessible from the top of the programmer actuator system 100. The socket boxes 204 are opened by pressure from the sliding actuator plate 114, which activate a socket box opening mechanism (not shown) within the programming assembly 202. A micro device handling mechanism (not shown) such as a pick and place system places the programmable device 206 inside the socket boxes 204 and removes them after the programming is complete while the sliding actuator plate 114 keeps the socket boxes 204 opened.

While the sliding actuator plate 114 is in an upward position, the socket boxes 204 are covered. Activation of the linear actuators 126 push the cross bar 124 downward, and with it, the first movable arm 110, the second movable arm 112, and the sliding actuator plate 114. Thus, activation of the linear actuators 126 generates motion of the sliding actuator plate 114 against the opening mechanism in the socket boxes 204, enabling insertion or removal of the programmable device 206 from the socket boxes 204.

It has been discovered that one advantage of the programmer actuator system 100 is that the linear actuators 126 are located under the sliding actuator plate 114 such that the line of force being applied on the programming assembly 202 is placed at a location that minimizes the moment arm on the first guide bar 120 and the second guide bar 122, thus minimizing wear.

The sliding actuator plate 114 includes a first adjustable bar 208 and a second adjustable bar 210 that are secured to the rest of the sliding actuator plate 114 using screws 212 positioned in slots 214. The position of the first adjustable bar 208 with respect to the second adjustable bar 210 defines a variable-width opening 216 that may be adjusted to accept the socket boxes 204 in the programming assembly 202. It has been discovered that the existence of the variable-width opening 216 solves the requirement for a different design for the sliding actuator plate 114 for each version of the socket boxes 204.

Figure 3:
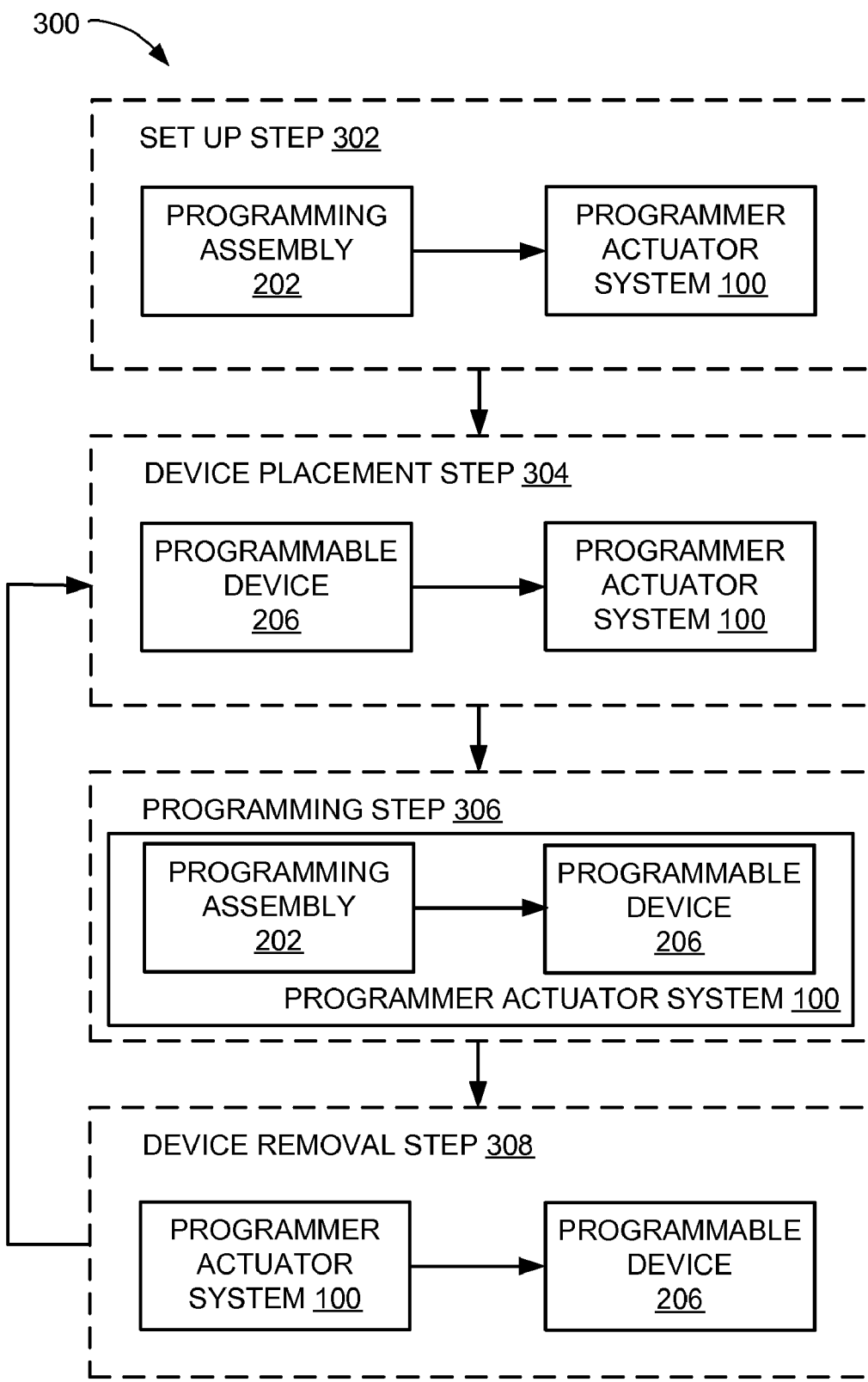
FIG. 3 is a schematic diagram outlining a method of operation of the programmer actuator system of FIG. 2.

Referring now to FIG. 3, therein is shown a schematic diagram outlining a method 300 of operation of the programmer actuator system 100 of FIG. 2. Operation of the programmer actuator system 100 includes a set-up step 302, a device placement step 304, a device programming step 306, and a device removal step 308. One advantage of the programmer actuator system 100 is that its design simplifies the set-up step 302, enabling a quick exchange of the programming assembly 202 supporting the programmable device 206

In the set-up step 302, the first movable arm 110 and the second movable arm 112 shown in FIG. 2 are held in the uppermost position manually or through spring return cylinders (not shown) placed at the bottom portion of the first guide bar 120 of and at the bottom portion of the second guide bar 122 shown in FIG. 1. As part of the set-up step 302, the sliding actuator plate 114 is removed from the programmer actuator system 100, and the screws 136 are removed from the support bracket 104, allowing rotation of the pivoting arm bracket 108 and exchange of the programming assembly 202.

Once the programming assembly 202 is in place, screws 136 are tightened down, securing the pivoting arm bracket 108 against the programming assembly 202. Following the installation of the programming assembly 202, the sliding actuator plate 114 is slid back into the first groove 116 and the second groove 118.

Figure 4:
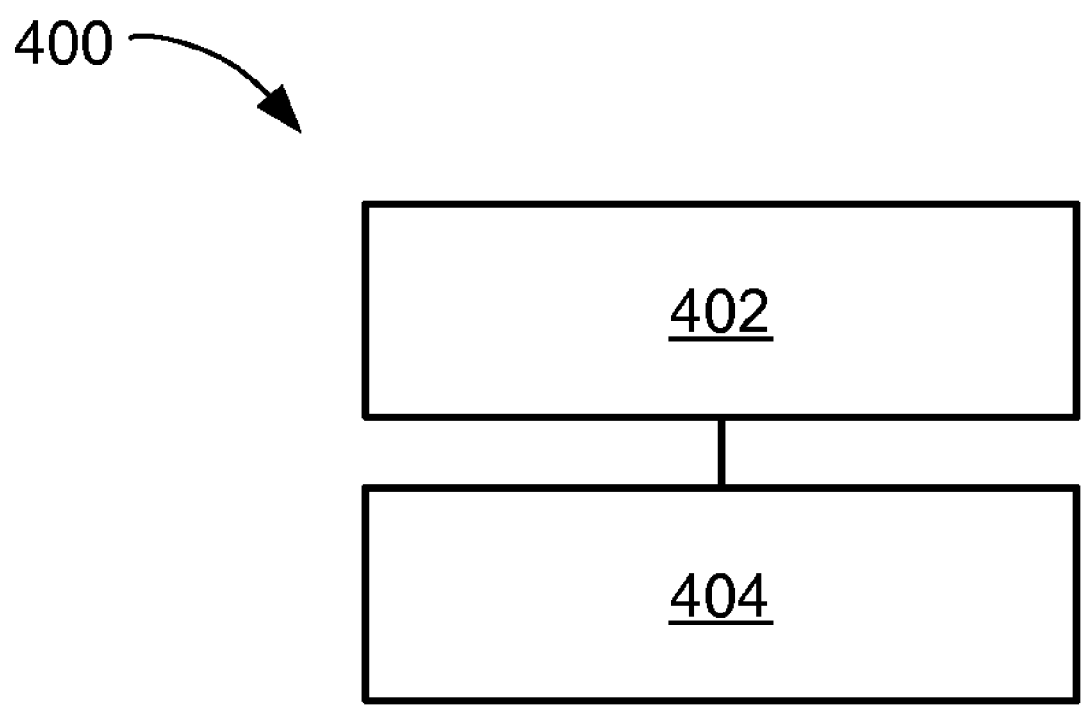
FIG. 4 is a flow chart of a method of operation of a programmer actuator system in a further embodiment of the present invention.

Referring now to FIG. 4, therein is shown a flow chart of a method 400 of operation of the programmer actuator system 100 in a further embodiment of the present invention. The method 400 includes: placing a programming assembly, having socket boxes, in the programming actuator system in a block 402; and clamping the programming assembly in the programming actuator system using a pivoting arm bracket in a block 404.

It has been discovered that the programmer actuator system 100 of the present invention furnishes important and heretofore unknown and unavailable solutions, capabilities, and functional aspects for quickly setting up in-line programming of non-volatile memory devices.

The resulting processes and configurations are straightforward, cost-effective, uncomplicated, highly versatile and effective, can be surprisingly and unobviously implemented by adapting known technologies, and are thus readily suited for efficiently and economically manufacturing semiconductor packages fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a programmer actuator system comprising:
    placing a programming assembly, having socket boxes, in the programmer actuator system between a mounting plate and a pivoting arm bracket;
    clamping the programming assembly in the programmer actuator system using the pivoting arm bracket; and
    opening the socket boxes with a sliding actuator plate, the sliding actuator plate including a variable-width opening for accommodating the socket boxes.

2. The method as claimed in claim 1 further comprising placing a programmable device inside the programming assembly.

3. The method as claimed in claim 1 further comprising adjusting the size of the variable-width opening for accommodating the socket boxes in the programming assembly.

4. The method as claimed in claim 1 further comprising pushing the sliding actuator plate against the socket boxes in the programming assembly.

5. The method as claimed in claim 1 further comprising pushing the sliding actuator plate against the socket boxes in the programming assembly by downward motion of a linear actuator against a cross bar connected to the sliding actuator plate.

6. A method of operation of a programmer actuator system comprising:
    placing a programming assembly, having socket boxes, between a mounting plate and a pivoting arm bracket;
    clamping the programming assembly in the programmer actuator system using the pivoting arm bracket;
    opening the socket boxes with a sliding actuator plate, the sliding actuator plate including a variable width opening for accomodating the socket boxes; and
    supporting the sliding actuator plate with a first movable arm and a second movable arm.

7. The method as claimed in claim 6 further comprising placing a programmable device inside the programming assembly.

8. The method as claimed in claim 6 further comprising adjusting the position of a first adjustable bar with respect to a second adjustable bar in the sliding actuator plate to provide the variable-width opening for accommodating the socket boxes in the programming assembly.

9. The method as claimed in claim 6 further comprising pushing the sliding actuator plate against the socket boxes in the programming assembly.

10. The method as claimed in claim 6 further comprising pushing the sliding actuator plate against the socket boxes in the programming assembly by downward motion of a linear actuator against a cross bar connected to the sliding actuator plate.

11. A programmer actuator system comprising:
    a programming assembly, having socket boxes, fitting within the programmer actuator system;
    a pivoting arm bracket for clamping the programming assembly in the programmer actuator system between a mounting plate and the pivoting arm bracket; and
    a sliding actuator plate for opening the socket boxes, the sliding actuator plate including a variable-width opening for accomodating the socket boxes.

12. The system as claimed in claim 11 further comprising a programmable device placed inside the programming assembly.

13. The system as claimed in claim 11 wherein a size of the variable-width opening adjustable for accommodating the socket boxes in the programming assembly.

14. The system as claimed in claim 11 wherein the sliding actuator plate pushes against the socket boxes in the programming assembly.

15. The system as claimed in claim 11 further comprising a cross bar connected to the sliding actuator plate for transferring the motion of a linear actuator to the sliding actuator plate.

16. The system as claimed in claim 11 further comprising a programmable device placed inside the socket boxes.

17. The system as claimed in claim 11 wherein the sliding actuator plate pushes against the socket boxes in the programming assembly to enable insertion or removal of a programmable device.

18. The system as claimed in claim 11 further comprising a cross bar connected to movable arms and the sliding actuator plate for transferring the motion of a linear actuator to the sliding actuator plate.

* * * * *